(12) United States Patent
Molesa et al.

(10) Patent No.: US 9,559,228 B2
(45) Date of Patent: Jan. 31, 2017

(54) SOLAR CELL WITH DOPED GROOVE REGIONS SEPARATED BY RIDGES

(75) Inventors: Steven Edward Molesa, San Jose, CA (US); Thomas Pass, San Jose, CA (US); Steve Kraft, Albany, CA (US)

(73) Assignee: SunPower Corporation, San Jose, CA (US)

( * ) Notice: Subject to any disclaimer, the term of this patent is extended or adjusted under 35 U.S.C. 154(b) by 1022 days.

(21) Appl. No.: 13/250,988

(22) Filed: Sep. 30, 2011

(65) Prior Publication Data

US 2013/0081680 A1   Apr. 4, 2013

(51) Int. Cl.
*H01L 31/00* (2006.01)
*H01L 31/0236* (2006.01)
*H01L 31/0224* (2006.01)
*H01L 31/0352* (2006.01)
*H01L 31/068* (2012.01)
*H01L 31/18* (2006.01)

(52) U.S. Cl.
CPC . *H01L 31/02363* (2013.01); *H01L 31/022441* (2013.01); *H01L 31/0352* (2013.01); *H01L 31/0682* (2013.01); *H01L 31/1804* (2013.01); *Y02E 10/50* (2013.01); *Y02E 10/547* (2013.01); *Y02P 70/521* (2015.11)

(58) Field of Classification Search
CPC .............. H01L 31/0682; H01L 31/022441; H01L 31/02363; H01L 31/0352; Y02E 10/50; Y02E 10/547
USPC ........................................ 136/252, 255, 256
See application file for complete search history.

(56) References Cited

U.S. PATENT DOCUMENTS

| | | | |
|---|---|---|---|
| 4,283,589 A * | 8/1981 | Kaplow et al. | 136/249 |
| 4,352,948 A * | 10/1982 | Kaplow et al. | 136/249 |
| 4,473,523 A | 9/1984 | Sasaki et al. | |
| 4,927,770 A | 5/1990 | Swanson | |
| 5,030,295 A | 7/1991 | Swanson et al. | |
| 5,053,083 A * | 10/1991 | Sinton | H01L 31/03529 136/255 |
| 5,057,439 A | 10/1991 | Swanson et al. | |

(Continued)

FOREIGN PATENT DOCUMENTS

| CN | 101142690 | 3/2008 |
|---|---|---|
| CN | 101553921 | 10/2009 |

(Continued)

OTHER PUBLICATIONS

Soltman et al., "Inkjet-Printed Line Morphologies and Temperature Control of the Coffee Ring Effect," American Chemical Society, 2008, vol. 24, No. 5, pp. 2224-2231 (published on Web Jan. 16, 2008).

(Continued)

*Primary Examiner* — Lindsey Bernier
(74) *Attorney, Agent, or Firm* — Blakely Sokoloff Taylor Zafman LLP (57) ABSTRACT

Solar cells with doped groove regions separated by ridges and methods of fabricating solar cells are described. In an example, a solar cell includes a substrate having a surface with a plurality of grooves and ridges. A first doped region of a first conductivity type is disposed in a first of the grooves. A second doped region of a second conductivity type, opposite the first conductivity type, is disposed in a second of the grooves. The first and second grooves are separated by one of the ridges.

5 Claims, 10 Drawing Sheets

(56) References Cited

U.S. PATENT DOCUMENTS

| | | | |
|---|---|---|---|
| 5,747,381 | A | 5/1998 | Wu et al. |
| 7,709,307 | B2 | 5/2010 | Kamath et al. |
| 7,767,520 | B2 | 8/2010 | Kamath et al. |
| 7,901,656 | B2 | 3/2011 | Winter et al. |
| 7,977,240 | B1 | 7/2011 | Rockenberger et al. |
| 8,399,878 | B2 | 3/2013 | Hieslmair et al. |
| 8,426,905 | B2 | 4/2013 | Kamath et al. |
| 2004/0025932 | A1* | 2/2004 | Husher .................. 136/256 |
| 2006/0094189 | A1 | 5/2006 | Zurcher et al. |
| 2007/0095445 | A1 | 5/2007 | Gangopadhyay et al. |
| 2008/0035198 | A1 | 2/2008 | Teppe et al. |
| 2008/0314443 | A1* | 12/2008 | Bonner et al. ............. 136/255 |
| 2009/0205712 | A1 | 8/2009 | Cousins |
| 2009/0239363 | A1 | 9/2009 | Leung et al. |
| 2009/0286393 | A1 | 11/2009 | Mathew et al. |
| 2009/0301549 | A1 | 12/2009 | Moslehi |
| 2010/0081264 | A1 | 4/2010 | Leung et al. |
| 2010/0084729 | A1 | 4/2010 | Steinbrueck et al. |
| 2010/0099236 | A1 | 4/2010 | Kwon et al. |
| 2010/0139764 | A1 | 6/2010 | Smith |
| 2011/0003424 | A1 | 1/2011 | De Ceuster et al. |
| 2011/0021012 | A1 | 1/2011 | Leung et al. |
| 2011/0070681 | A1 | 3/2011 | Nakayashiki et al. |
| 2011/0318939 | A1 | 12/2011 | Shimoda et al. |
| 2012/0138138 | A1* | 6/2012 | Granek ............. H01L 31/1804 136/256 |
| 2012/0255603 | A1* | 10/2012 | Yu et al. .................. 136/256 |
| 2013/0081677 | A1 | 4/2013 | Loscutoff et al. |
| 2013/0081687 | A1 | 4/2013 | Wu et al. |
| 2013/0098266 | A1 | 4/2013 | Zhou et al. |

FOREIGN PATENT DOCUMENTS

| | | | |
|---|---|---|---|
| DE | 10 2009 011305 | | 9/2010 |
| JP | 2007134655 | | 5/2007 |
| KR | 100378343 | | 3/2003 |
| KR | 20070106818 | | 11/2007 |
| KR | 10-2011-0101141 | | 9/2011 |
| TW | 201121115 | | 6/2011 |
| WO | WO-2008141415 | | 11/2008 |
| WO | WO-2009/120437 | | 10/2009 |
| WO | WO-2009/145857 | | 12/2009 |
| WO | WO-2009-152146 | | 12/2009 |
| WO | WO-2009/152146 | | 12/2009 |
| WO | WO-2010/055346 | | 5/2010 |
| WO | WO-2010/079842 | | 7/2010 |
| WO | WO 2010099892 | A2 * | 9/2010 ......... H01L 31/1804 |
| WO | WO 2011073971 | A2 * | 6/2011 |

OTHER PUBLICATIONS

Molesa et al., "High-quality inkjet-printed multilevel interconnects and inductive components on plastic for ultra-low-cost RFID applications," Materials Research Society Symposium Proceedings, 2003, pp. H8.3.1-H8.3.6.

International Search Report and Written Opinion from PCT/US2012/057349 mailed Mar. 27, 2013, 9 pgs.

International Search Report and Written Opinion from PCT/US2012/057350 mailed Mar. 25, 2013, 13 pgs.

International Search Report and Written Opinion for PCT Patent Application No. PCT/US2012/057348 mailed Jul. 24, 2013, 12 pgs.

Non-Final Office Action from U.S. Appl. No. 13/250,215 mailed Sep. 6, 2013, 10 pgs.

Non-Final Office Action for U.S. Appl. No. 13/250,594 mailed Feb. 13, 2013, 17 pgs.

Notice of Allowance and Fees for U.S. Appl. No. 13/250,594 mailed Jul. 15, 2013, 11 pgs.

International Preliminary Report on Patentability dated Apr. 1, 2014, in International Patent Application No. PCT/US2012/057348, 9 pages.

International Preliminary Report on Patentability dated Apr. 1, 2014, in International Patent Application No. PCT/US2012/057349, 8 pages.

International Preliminary Report on Patentability dated Apr. 1, 2014, in International Patent Application No. PCT/US2012/057350, 9 pages.

Office Action mailed Mar. 5, 2014, in U.S. Appl. No. 13/250,215, 6 pages.

Written Opinion from Singapore Patent Application No. 11201401090P mailed Nov. 27, 2014, 6 pgs.

Written Opinion from Singapore Patent Application No. 11201401088Y mailed Feb. 5, 2015, 14 pgs.

Extended European Search Report from European Patent Application No. 12857538.8, mailed Jan. 28, 2015, 8 pgs.

Final Office Action from U.S. Appl. No. 13/250,215 mailed Sep. 5, 2014, 8 pgs.

Office Action for Chinese Patent Application No. 201280048030.9, mailed Feb. 16, 2015, 18 pgs.

Office Action for Chinese Patent Application No. 201280048109.1, mailed Sep. 6, 2015, 20 pgs.

Office Action for Chinese Patent Application No. 201280048309, mailed Jul. 31, 2015, 7 pgs.

Office Action for Chinese Patent Application No. 2012800480309, mailed Jan. 26, 2016, 10 pgs.

Office Action for Chinese Patent Application No. 201280048243.1, mailed Oct. 10, 2015, 9 pgs.

* cited by examiner

FIG. 9D ental support under contract number DE-FC36-07GO17043 awarded by the United States Department of Energy. The Government may have certain rights in the invention.

SOLAR CELL WITH DOPED GROOVE REGIONS SEPARATED BY RIDGES

The invention described herein was made with Governmental support under contract number DE-FC36-07GO17043 awarded by the United States Department of Energy. The Government may have certain rights in the invention.

TECHNICAL FIELD

Embodiments of the present invention are in the field of renewable energy and, in particular, solar cells with doped groove regions separated by ridges.

BACKGROUND

Photovoltaic cells, commonly known as solar cells, are well known devices for direct conversion of solar radiation into electrical energy. Generally, solar cells are fabricated on a semiconductor wafer or substrate using semiconductor processing techniques to form a p-n junction near a surface of the substrate. Solar radiation impinging on the surface of, and entering into, the substrate creates electron and hole pairs in the bulk of the substrate. The electron and hole pairs migrate to p-doped and n-doped regions in the substrate, thereby generating a voltage differential between the doped regions. The doped regions are connected to conductive regions on the solar cell to direct an electrical current from the cell to an external circuit coupled thereto Efficiency is an important characteristic of a solar cell as it is directly related to the capability of the solar cell to generate power. Likewise, efficiency in producing solar cells is directly related to the cost effectiveness of such solar cells. Accordingly, techniques for increasing the efficiency of solar cells, or techniques for increasing the efficiency in the manufacture of solar cells, are generally desirable. Embodiments of the present invention allow for increased solar cell manufacture efficiency by providing novel processes for fabricating solar cell structures.

DETAILED DESCRIPTION

Solar cells with doped groove regions separated by ridges are described herein. In the following description, numerous specific details are set forth, such as specific process flow operations, in order to provide a thorough understanding of embodiments of the present invention. It will be apparent to one skilled in the art that embodiments of the present invention may be practiced without these specific details. In other instances, well-known fabrication techniques, such as subsequent metal contact formation techniques, are not described in detail in order to not unnecessarily obscure embodiments of the present invention. Furthermore, it is to be understood that the various embodiments shown in the figures are illustrative representations and are not necessarily drawn to scale.

Disclosed herein are solar cells with doped groove regions separated by ridges. In one embodiment, a solar cell includes a substrate having a surface with a plurality of grooves and ridges. A first doped region of a first conductivity type is disposed in a first of the grooves. A second doped region of a second conductivity type, opposite the first conductivity type, is disposed in a second of the grooves. The first and second grooves are separated by one of the ridges.

Also disclosed herein are methods of fabricating solar cells. In one embodiment, a method includes forming a pattern having a plurality of grooves and ridges in a surface of a substrate. A first dopant ink composition of a first conductivity type is delivered in a first of the grooves. A second dopant ink composition of a second, opposite, conductivity type is delivered in a second of the grooves, the first and second grooves separated by one of the ridges. Dopants from the first and second dopant ink compositions are then driven toward the substrate. In another embodiment, a method includes forming a pattern having a plurality of grooves and ridges in a surface of a substrate. A dopant ink composition of a first conductivity type is delivered in a first of the grooves. A solid state dopant source of a second, opposite, conductivity type is formed in a second of the grooves and above the dopant ink composition in the first groove. The first and second grooves are separated by one of the ridges. Dopants are then driven from the solid state dopant source and the dopant ink composition toward the substrate.

Solvent based inkjet inks generally contain greater than approximately 50% solvent and additives in order to meet the viscosity requirements (e.g., approximately 5-20 centipoise) for inkjet printheads. Such a high fraction of solvents and additives may leads to variable or complex drying dynamics. For example, the drying dynamics may render shape fidelity challenging for certain inkjet applications. To address such issues, the graphics arts industry has developed adsorbent substrates that adsorb the inkjets drops upon contact. In this approach, the components that create the color are not able to move while the solvents are evaporating.

Using solvent based inkjet inks for electronics applications may introduce additional challenges. For example, the substrates for electronics applications are generally not absorbing (e.g., silicon substrates may not be absorbing) and, hence, the graphics solution may not be easily adapted to electronics applications. Furthermore, since the materials being printed have more advanced functions for electronics applications, including etch masks, doping sources, metallization, printed silicon, etc., than for than graphics arts applications, typically thickness control becomes an additional output parameter that may need to be well-controlled. Thickness may be more difficult to control than the shape definition due to the dynamic evaporating effects. The overall lack of thickness and shape definition may be further exacerbated when printing onto rough surfaces such as those used on solar cells. For example, fluid deposition processes are generally planarizing, especially at low viscosities.

One of the more successful strategies that have been implemented to control film thickness and shape definition for inkjet processes in electronics applications has been to use pre-patterned grooves or wells. For example, this approach has been used in the display industry to fabricate color filters with inkjet processes. The color inks are deposited into grooves or wells that are patterned using photolithographic techniques. Since inkjet technology may be used to precisely control the amount of ink jetted, the amount of filter material may also be precisely controlled. Given a known volume, the final film thickness may be precisely controlled since the volume of the groove or well is also precisely controlled through the photolithographic patterning process.

In accordance with one or more embodiments of the present invention, grooves or wells are used for thickness and shape control in the fabrication of a back contact solar cell. In general, a patterning step may be used to define grooves or trenches in a surface of the cell, followed by, e.g., a wet etch operation to etch grooves or trenches into the underlying layer. In one embodiment, dopant ink compositions are then dispensed in the grooves or wells for subsequent doping operations.

In one such embodiment, the above doping approach is accomplished through the addition of only one patterning process operation. In an example, incoming wafers from a supplier that may already require a damage removal etch in order to remove approximately 10-15 microns of contaminated and fractured silicon from the wafer surface are used. In an embodiment, prior to the damage removal etch, the wafer surface is subjected to a patterning operation, e.g., formation of a screen print etch mask. In one embodiment, the patterning operation determines locations for grooves or wells for both n-type and p-type fingers and pads. Following the patterning operation, the wafer is subjected to the damage removal etch operation as performed with the mask in place. However, a damage etch, ink strip, and then final damage etch to remove the silicon beneath the patterning mask may need to be subsequently performed.

In an embodiment, a horizontal etch tool is used to fabricate grooves or wells in the surface of a substrate. Such a tool may be less expensive than standard batch process etchers due to the more efficient utilization of rinse water. Furthermore, since the n- and p-fingers may be patterned in the same operation, the distance between the fingers may be minimized. By contrast, in conventional approaches where the n- and p-regions are patterned in two separate operations, there may be tolerance add-up between the alignments of the two requisite separate patterns. Accordingly, in conventional approaches, a minimum design rule is typically applied for determining how closely the patterns may be spaced. Thus, in an embodiment, by patterning the n- and p-regions in the same operation, e.g., by forming grooves or wells in the same operation, there is no tolerance add-up and the design rule can be violated. In one embodiment, minimizing the distance between the n- and p-regions increases the overall efficiency of a solar cell fabricated there from. The performance increase may lower the cost/Watt of the process flow as compared to a process made with standard design rules, perhaps offsetting any additional cost associated with adding the groove or well patterning operation. In an embodiment, smoothing of the bottom of the grooves or wells is additionally performed such that the roughness from the surface of the wafer is not mimicked at the bottom of the groove or trench. In such a case, a wet etch polishing technique may also be incorporated during the etching of the grooves or wells, e.g., as performed in a damage etch tool.

Dopant inks may enable the use of liquid deposition methods in solar cell fabrication (and, perhaps, more generally semiconductor structure fabrication) as a route to selectively doping a substrate. Such liquid deposition methods may offer reduced cost relative to typical vapor-phase dopant deposition techniques, which typically involve expensive furnaces and vacuum chambers in addition to toxic gas delivery and exhaust systems. Embodiments of the present invention may be implemented in a variety of solar cell technology platforms. In one embodiment, a dopant ink composition is used as either a p-type or n-type dopant source. In another embodiment, a dopant ink composition is used as one or both of the p-type and n-type dopant sources. In an embodiment, the dopant ink is received by an etched groove or well at the surface of the receiving wafer or substrate. In one embodiment, the dopant ink includes a cross-linkable siloxane, a solvent and a p-type or n-type (relative to silicon) dopant source. In an embodiment, doped regions are formed in the wafer or substrate, or in a semiconductor layer formed thereon, as a precursor to the final fabrication of a back-contact solar cell.

In an aspect of the present invention, a solar cell having doped regions among pluralities of grooves and ridges is provided. As a first example, FIG. 1 illustrates a cross-sectional view of a portion of a solar cell having doped regions separated by undoped or lightly doped portions of a ridge, in accordance with an embodiment of the present invention.

Figure 1:
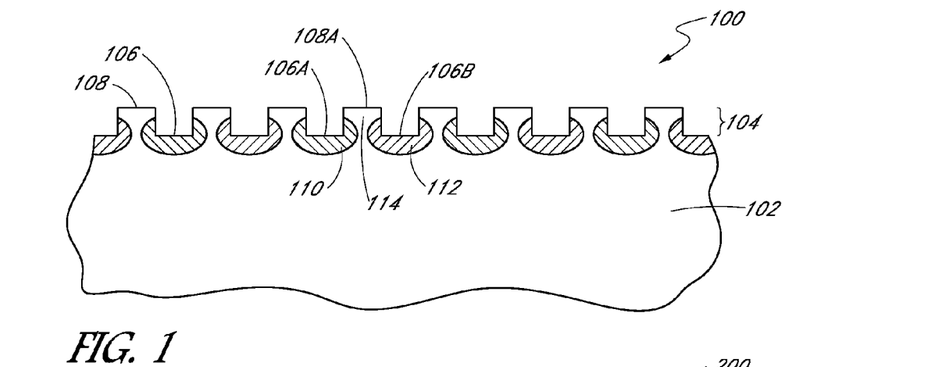
FIG. 1 illustrates a cross-sectional view of a portion of a solar cell having doped regions separated by undoped or lightly doped portions of a ridge, in accordance with an embodiment of the present invention.

Referring to FIG. 1, a portion of a solar cell 100 includes a substrate 102 having a surface 104 with a plurality of grooves 106 and ridges 108. A first doped region 110 of a first conductivity type is disposed in a first of the grooves 106A. A second doped region 112 of a second conductivity type, opposite the first conductivity type, is disposed in a second of the grooves 106B. The first and second grooves 106A and 106B, respectively, are separated by one of the ridges 108A.

In an embodiment, the groove is formed to act as a receiving groove or well for a dopant ink. The groove may be formed as an intentional feature as opposed to, say, a natural surface depression. In one embodiment, the groove is etched by a wet etch or a dry etch process. The surface of the bottom of the groove may be textured or may be smooth. There may be no geometric limitation implied by the term "groove." For example, in one embodiment, from a plan view perspective, the groove is a finger or a dot. In an embodiment, the groove is has a depth approximately in the range of 5-10 microns. In a specific example, the groove depth is sized to receive a precise amount of dopant ink.

In an embodiment, the substrate 102 is a silicon substrate, e.g., an n-type doped silicon substrate. The doping concentration in the substrate itself is, in an embodiment, at least 1-2 orders of magnitude less than the doping concentration of the first and second doped regions 110 and 112. In one such embodiment, the ridge 108A separating the first and second grooves 106 A and 106B thus includes a lightly doped region 114 from the substrate. In another embodiment, however, region 114 is undoped or is negligibly doped. The first and second doped regions 110 and 112 may be n-type and p-type doped, respectively, or may be p-type and n-type doped, respectively.

Referring again to FIG. 1, in an embodiment, the first doped region 110 extends by an amount into the ridge 108A from a first side of the ridge, and the second doped region 112 extends by approximately the same amount into the ridge 108A from a second side of the ridge. In a specific exemplary embodiment, the amount that each of the regions extends is approximately 1 micron. In one embodiment, the undoped or lightly doped region 114 extends from the first side of the ridge to the second side of the ridge above the portions of the first and second doped regions 110 and 112, respectively, that extend into the ridge. In a specific embodiment, the undoped or lightly doped region 114 is further disposed between the portions of the first and second doped regions 110 and 112 that extend into the ridge 108A, as is depicted in FIG. 1.

Figure 2:
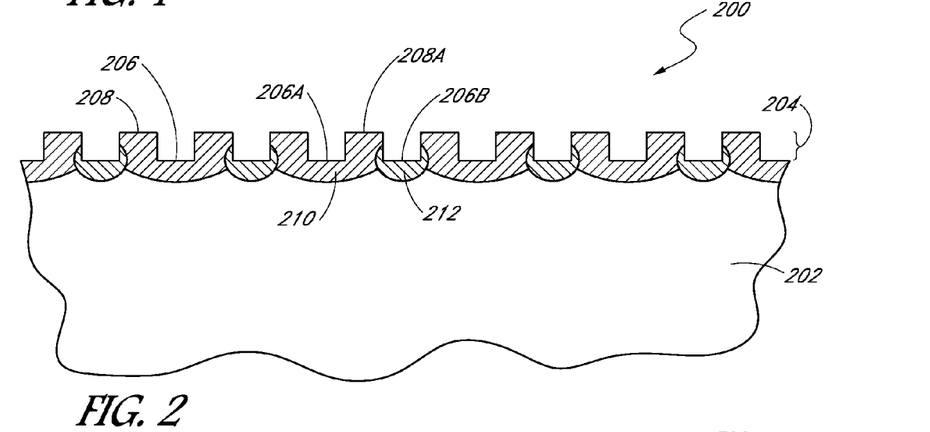
FIG. 2 illustrates a cross-sectional view of a portion of a solar cell having doped regions contiguous with one another, in accordance with an embodiment of the present invention.

As a second example, FIG. 2 illustrates a cross-sectional view of a portion of a solar cell having doped regions contiguous with one another, in accordance with an embodiment of the present invention.

Referring to FIG. 2, a portion of a solar cell 200 includes a substrate 202 having a surface 204 with a plurality of grooves 206 and ridges 208. A first doped region 210 of a first conductivity type is disposed in a first of the grooves 206A. A second doped region 212 of a second conductivity type, opposite the first conductivity type, is disposed in a second of the grooves 206B. The first and second grooves 206A and 206B, respectively, are separated by one of the ridges 208A. However, in contrast to FIG. 1, the ridge 208A separating the first and second grooves 206A and 206B, respectively, includes dopants of first conductivity type continuous with the first doped region 210 and contiguous with the second doped region 212. That is, the first doped region 210 extends through the ridge 208A such that no undoped or lightly doped region remains in the ridge 208A. In one such embodiment, however, similar to FIG. 1, the second doped region 212 extends by an amount into the ridge 208A, as is depicted in FIG. 2.

Thus, referring to both FIGS. 1 and 2, the first doped region (110 or 210) is disposed in a portion of the substrate (102 or 202) below a surface of the first groove (106A or 206A), and the second doped region (112 or 212) is disposed in another portion of the substrate (102 or 202) below a surface of the second groove (106B or 206B). By contrast, and as a third example, FIG. 3 illustrates a cross-sectional view of a portion of a solar cell having doped regions formed in but not below the surface of a plurality of grooves, in accordance with an embodiment of the present invention.

Figure 3:
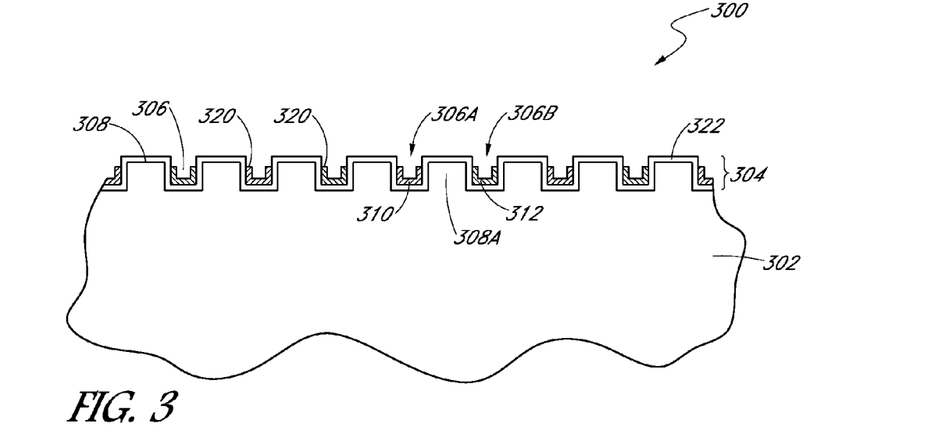
FIG. 3 illustrates a cross-sectional view of a portion of a solar cell having doped regions formed in but not below the surface of a plurality of grooves, in accordance with an embodiment of the present invention.

Referring to FIG. 3, a portion of a solar cell 300 includes a substrate 302 having a surface 304 with a plurality of grooves 306 and ridges 308. A semiconductor layer 320 is disposed in each of the grooves 306. In one embodiment, the semiconductor layer 320 is conformal with at least a portion of each groove 306, but is discontinuous between grooves 306, as is depicted in FIG. 3. A first doped region 310 of a first conductivity type is disposed in a first of the grooves 306A. Specifically, the first doped region 310 is disposed in the portion of the semiconductor layer 320 disposed in the first groove 306A. A second doped region 312 of a second conductivity type, opposite the first conductivity type, is disposed in a second of the grooves 306B. Specifically, the second doped region 312 is disposed in the portion of the semiconductor layer 320 disposed in the second groove 306B. Furthermore, the first and second grooves 306A and 306B, respectively, are separated by one of the ridges 308A, as depicted in FIG. 3.

Referring again to FIG. 3, a thin dielectric layer 322, such as a layer of silicon dioxide, is included between the semiconductor layer 320 and the substrate 302. As shown, the thin dielectric layer 322 is not patterned and is therefore a global layer. However, it is to be understood that the thin dielectric layer 322 may be patterned to reside in only the grooves 306 but not along the top surfaces of the ridges 308, similar to the pattern of the semiconductor layer 320. Furthermore, a passivation oxide layer may be included as disposed over the semiconductor layer 320 and the thin dielectric layer 322.

In an embodiment, the semiconductor layer 320 includes a substantial amount of silicon atoms. In one such embodiment, the semiconductor layer 320 is composed of polycrystalline silicon or amorphous silicon and is formed by either fluid deposition (e.g., such as printing) or a deposition and etch process. In a specific embodiment, the substrate 302 is composed of silicon, such as n-type silicon, the semiconductor layer is composed of polycrystalline silicon, the first doped region 310 includes n-type dopants for silicon, and the second doped region 312 comprises p-type dopants for silicon.

Figure 4:
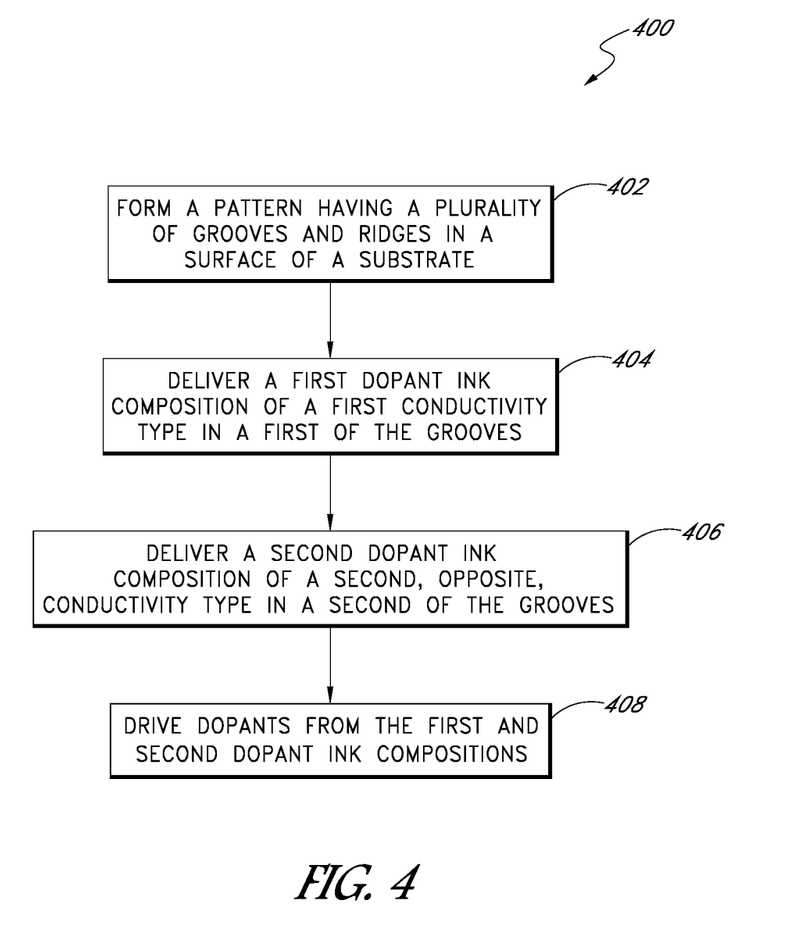
FIG. 4 is a flowchart representing operations in a method of fabricating a solar cell, in accordance with an embodiment of the present invention.

In another aspect of the present invention, a solar cell may be fabricated by forming doped regions in a semiconductor layer disposed in grooves formed in a surface of a substrate. For example, FIG. 4 is a flowchart 400 representing operations in a method of fabricating a solar cell, in accordance with an embodiment of the present invention. FIGS. 5A-5F illustrate cross-sectional views of various stages in the fabrication of a solar cell, corresponding to operations of flowchart 400, in accordance with an embodiment of the present invention.

Figure 5A:
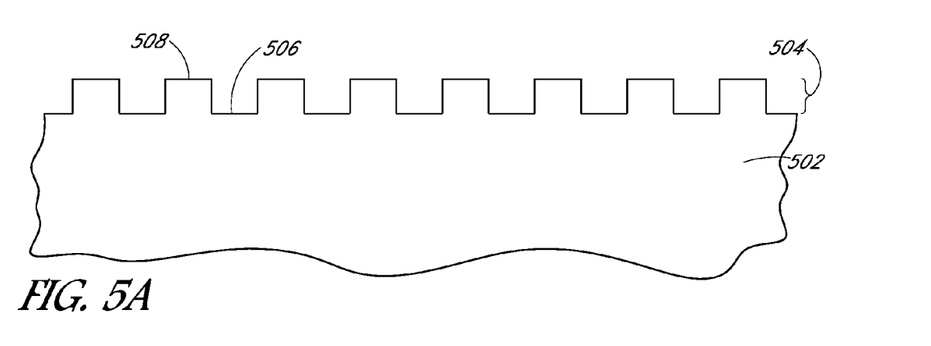
FIG. 5A illustrates a cross-sectional view of a stage in the fabrication of a solar cell, corresponding to operation 402 of the flowchart of FIG. 4, in accordance with an embodiment of the present invention.

Referring to operation 402 of flowchart 400, and corresponding FIG. 5A, a method of fabricating a solar cell includes forming a pattern having a plurality of grooves 506 and ridges 508 in a surface 504 of a substrate 502.

In an embodiment, forming the pattern includes first masking a damaged silicon surface with an epoxy or photoresist mask. The pattern of the mask is then transferred into the surface of the substrate by, e.g., an etch process such as an alkaline wet etch process. In one embodiment, forming the pattern in the surface of the substrate includes, prior to delivering the first dopant ink composition, reducing a roughness at the bottom of each of the plurality of grooves, e.g., with a wet etch process such as HF/nitric acid. In another embodiment, forming the pattern in the surface of the substrate includes, prior to delivering the first dopant ink composition, increasing a roughness or introducing a texture at the bottom of each of the plurality of grooves, e.g., with a wet etch process such as an alkaline etch based on potassium hydroxide. An exemplary process is described below in association with FIGS. 9A-9D.

Figure 5B:
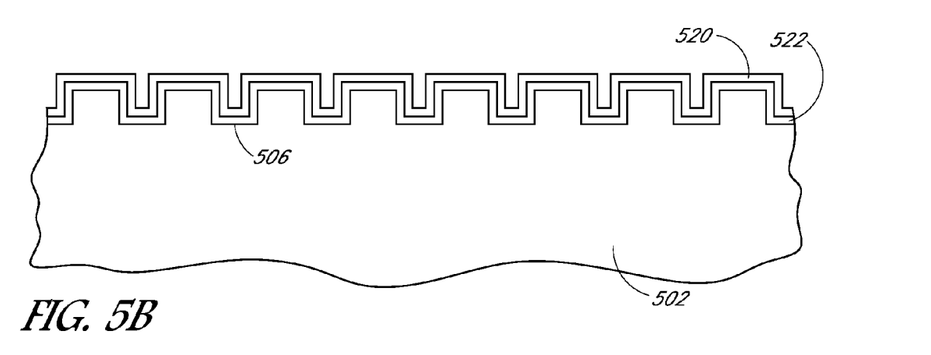
FIG. 5B illustrates a cross-sectional view of a stage in the fabrication of a solar cell, in accordance with an embodiment of the present invention.

Referring to FIG. 5B, in one embodiment, a semiconductor layer 520 and a thin dielectric layer 522 are formed in each of the grooves 506 of the substrate 502. The semiconductor layer 520 and thin dielectric layer 522 may be composed of materials described in association with semiconductor layer 320 and thin dielectric layer 322 of FIG. 3.

Figure 5C:
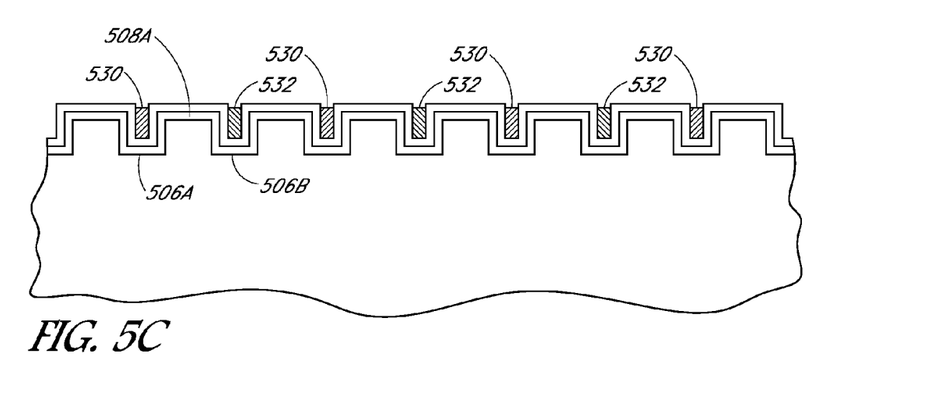
FIG. 5C illustrates a cross-sectional view of a stage in the fabrication of a solar cell, corresponding to operations 404 and 406 of the flowchart of FIG. 4, in accordance with an embodiment of the present invention.

Referring to operation 404 of flowchart 400, and corresponding FIG. 5C, the method also includes delivering a first dopant ink composition 530 of a first conductivity type in a first of the grooves 506A. Referring to operation 406 of flowchart 400, and again to FIG. 5C, the method also includes delivering a second dopant ink composition 532 of a second, opposite, conductivity type in a second of the grooves 506B. The first and second grooves 506A and 506B, respectively, are separated by one of the ridges 508A. In an embodiment, the first dopant ink composition 530 includes p-type dopants and the second dopant ink composition 532 includes n-type dopants. In another embodiment, the first dopant ink composition 530 includes n-type dopants and the second dopant ink composition 532 includes p-type dopants.

Figure 5D:
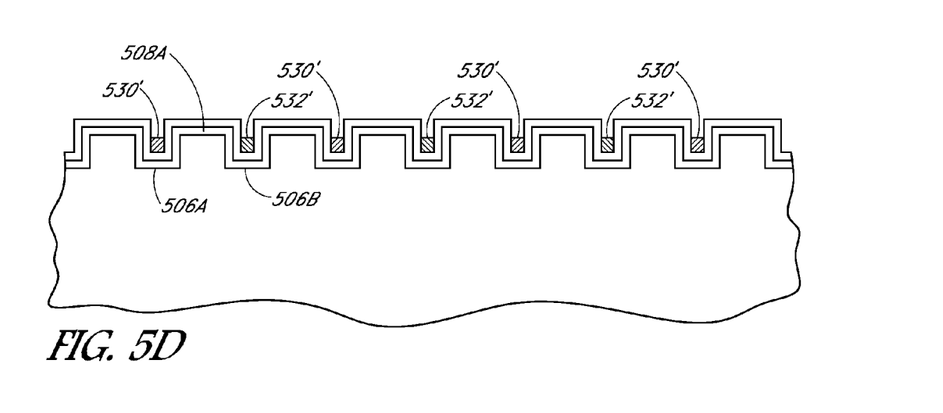
FIG. 5D illustrates a cross-sectional view of a stage in the fabrication of a solar cell, in accordance with an embodiment of the present invention.

Referring to FIG. 5D, in an embodiment, the volume of the first and second dopant ink compositions 530 and 532 is reduced to provide reduced volume regions 530' and 532', as described in greater detail below in association with operation 408.

Figure 5E:
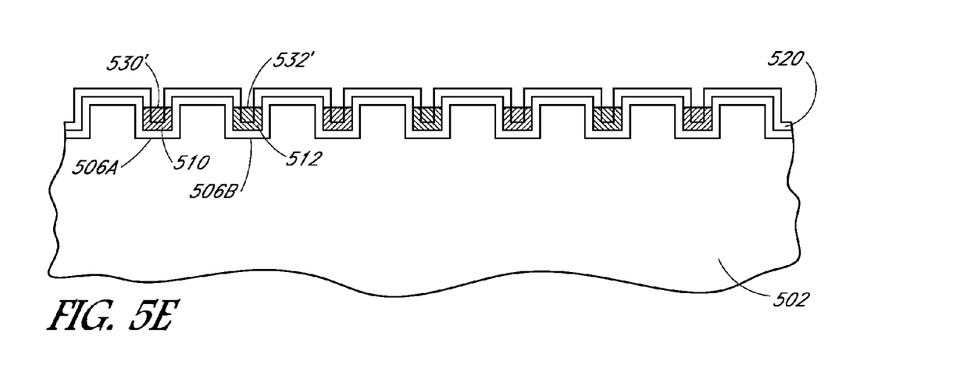
FIG. 5E illustrates a cross-sectional view of a stage in the fabrication of a solar cell, corresponding to operation 408 of the flowchart of FIG. 4, in accordance with an embodiment of the present invention.

Referring to operation 408 of flowchart 400, and corresponding FIG. 5E, the method also includes driving dopants from the first and second dopant ink compositions 530 and 532 (or reduced volume regions 530' and 532') toward the substrate 502. Specifically, in one embodiment, driving dopants from the first and second dopant ink compositions 530 and 532 includes forming a first doped region 510 of the first conductivity type in the portion of the semiconductor layer 520 disposed in the first groove 506A, and forming a second doped region 512 of the second conductivity type in the portion of the semiconductor layer 520 disposed in the second groove 506B, as is depicted in FIG. 5E. Alternatively, in an embodiment not including the semiconductor layer 520, driving dopants from the first and second dopant ink compositions 530 and 532 includes forming a first doped region of the first conductivity type in a portion of the substrate 502 below a surface of the first groove 506A, and forming a second doped region of the second conductivity type in another portion of the substrate 502 below a surface of the second groove 506B.

In an embodiment, delivering the first dopant ink composition 530, delivering the second dopant ink composition 532, or both, includes using a technique such as, but not limited to, ink jetting, screen printing, blading, transferring by pipette, spin coating and etching, gravure printing, or slot-die coating. In an embodiment, prior to driving dopants from the first and second dopant ink compositions 530 and 532, the first and second dopant ink compositions 530 and 532 are cured to cross-link a substantial portion of, e.g., siloxane species of the first and second dopant ink compositions 530 and 532. In one such embodiment, the curing is performed by using a non-thermal process. In another such embodiment, the curing is performed by using a baking process. In a specific embodiment, performing the baking process removes a substantial portion of an organic solvent of each of the first and second dopant ink compositions 530 and 532.

The solvent removal may lead to volume reduction of the ink. For example, in a particular embodiment, the baking process reduces a volume of the first and second dopant ink compositions 530 and 532 by a factor approximately in the range of 1.1-10, e.g., to provide reduced volume regions 530' and 532', as depicted in FIGS. 5D and 5E. In an embodiment, the baking process includes heating to a temperature approximately in the range of 100-400 degrees Celsius, and driving dopants from the cured first and second dopant ink compositions includes heating to a temperature approximately in the range of 850-1050 degrees Celsius.

Figure 5F:
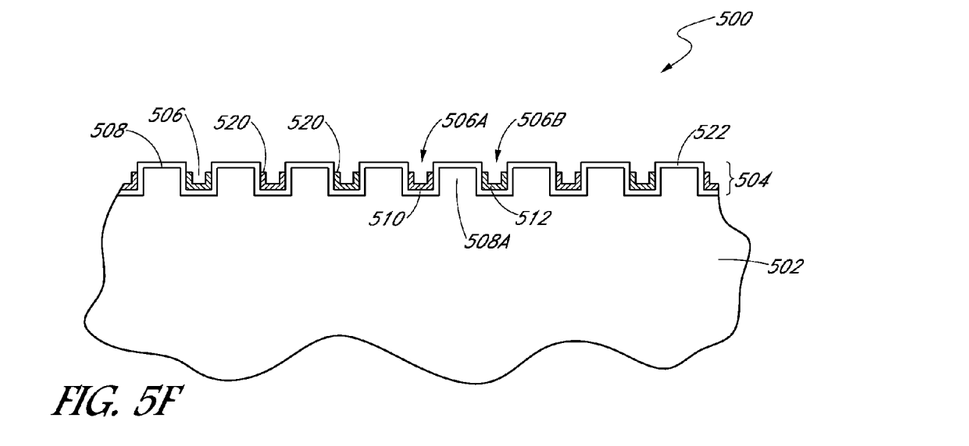
FIG. 5F illustrates a cross-sectional view of a stage in the fabrication of a solar cell, in accordance with an embodiment of the present invention.

Referring to FIG. 5F, the undoped portions of the semiconductor layer 520 along with the dopant ink compositions 530' and 532' are removed, e.g., by a wet etch process. The structure shown in FIG. 5F may then be used to fabricate a back-contact solar cell.

Figure 6:
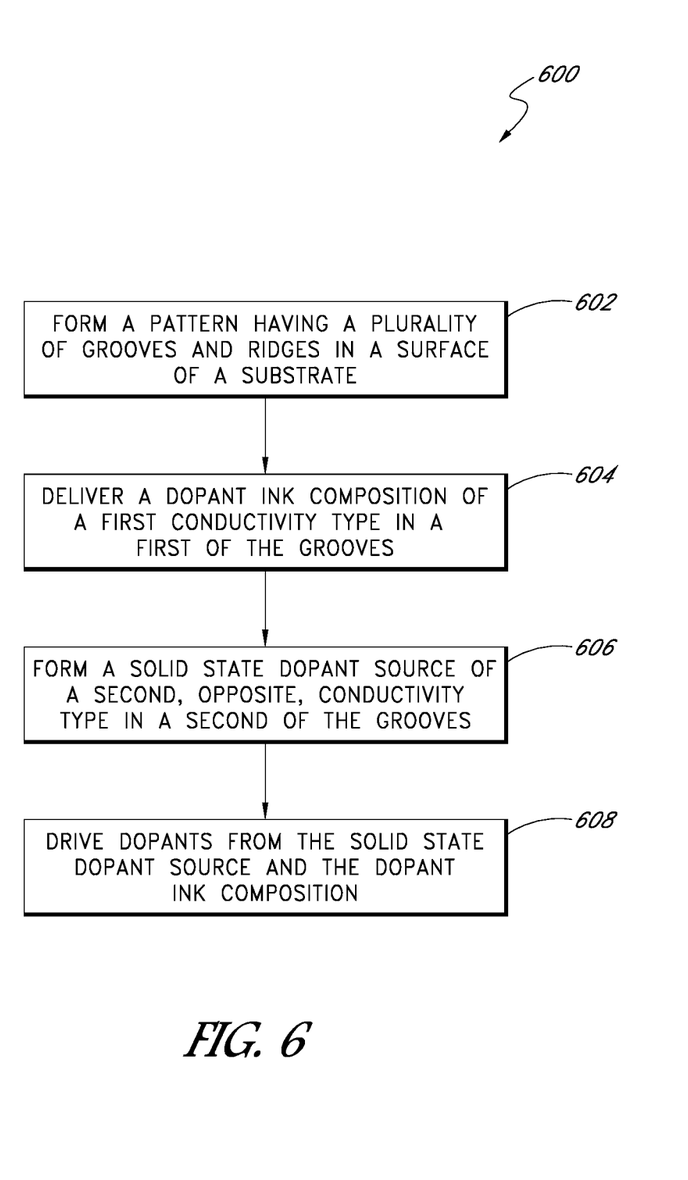
FIG. 6 is a flowchart representing operations in another method of fabricating a solar cell, in accordance with an embodiment of the present invention.

In another aspect of the present invention, a solar cell may be fabricated by forming doped regions from a dopant ink composition for a first conductivity type and from a solid state dopant source for a second conductivity type. For example, FIG. 6 is a flowchart 600 representing operations in a method of fabricating a solar cell, in accordance with an embodiment of the present invention. FIGS. 7A-7F illustrate cross-sectional views of various stages in the fabrication of a solar cell, corresponding to operations of flowchart 600, in accordance with an embodiment of the present invention.

Figure 7A:
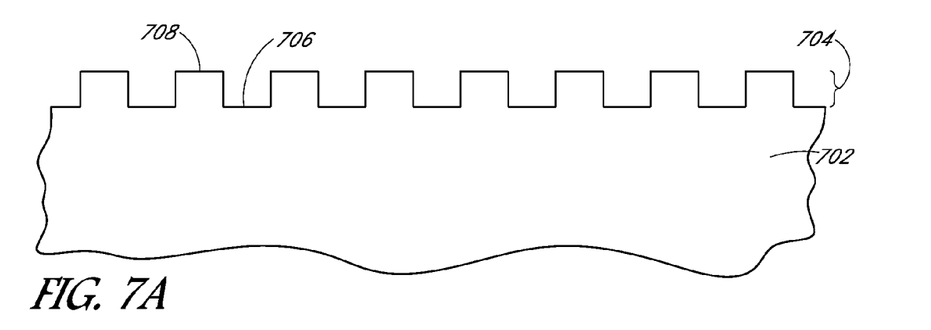
FIG. 7A illustrates a cross-sectional view of a stage in the fabrication of a solar cell, corresponding to operation 602 of the flowchart of FIG. 6, in accordance with an embodiment of the present invention.

Referring to operation 602 of flowchart 600, and corresponding FIG. 7A, a method of fabricating a solar cell includes forming a pattern having a plurality of grooves 706 and ridges 708 in a surface 704 of a substrate 702. Approaches similar to those described above in association with operation 402 of flowchart 400 may be used to form the patterned substrate. For example, in one embodiment, forming the pattern in the surface of the substrate 702 includes reducing a roughness at the bottom of each of the plurality of grooves 706.

Figure 7B:
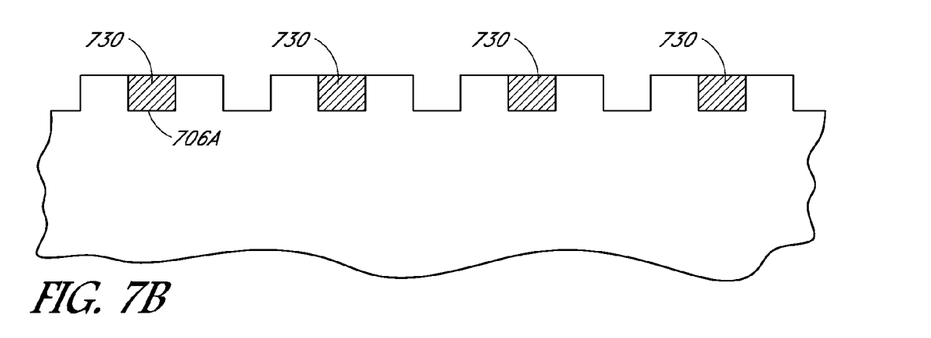
FIG. 7B illustrates a cross-sectional view of a stage in the fabrication of a solar cell, corresponding to operation 604 of the flowchart of FIG. 6, in accordance with an embodiment of the present invention.

Referring to operation 604 of flowchart 600, and corresponding FIG. 7B, the method also includes delivering a dopant ink composition 730 of a first conductivity type in a first of the grooves 706A or into a first set of the grooves. The dopant ink composition may be p-type or n-type and may have a composition similar or the same as the dopant ink compositions described above. Furthermore, the dopant ink composition may be delivered in a manner similar to the approaches described above.

Figure 7C:
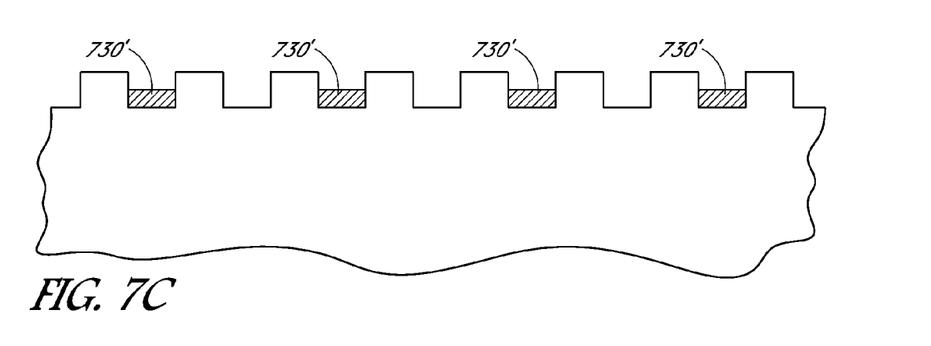
FIG. 7C illustrates a cross-sectional view of a stage in the fabrication of a solar cell, in accordance with an embodiment of the present invention.

Referring to FIG. 7C, in an embodiment, the volume of the dopant ink compositions 730 is reduced to provide reduced volume regions 730', as described in greater detail below in association with operation 706.

Figure 7D:
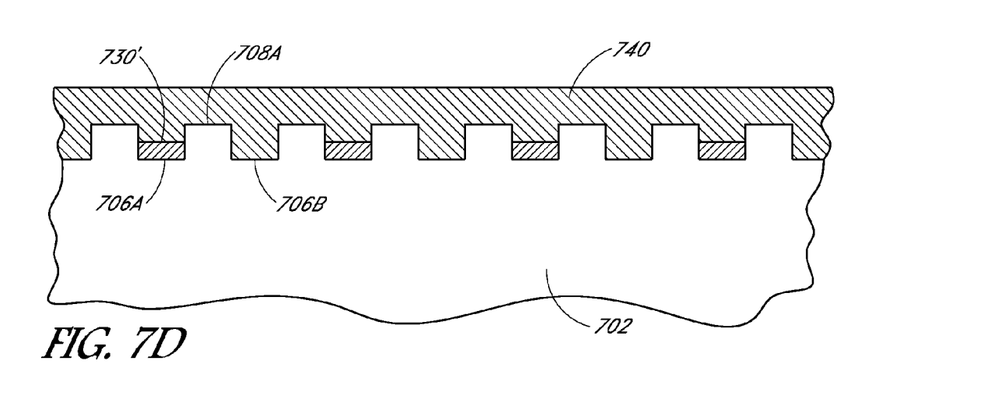
FIG. 7D illustrates a cross-sectional view of a stage in the fabrication of a solar cell, corresponding to operation 606 of the flowchart of FIG. 6, in accordance with an embodiment of the present invention.

Referring to operation 606 of flowchart 600, and corresponding FIG. 7D, the method also includes forming a solid state dopant source 740 of a second, opposite, conductivity type in a second of the grooves 706B or into a second set of the grooves. The first and second grooves 706A and 706B, respectively, are separated by one of the ridges 708A. In one embodiment, the solid state dopant source 740 is blanket deposited above the substrate 702 and is further disposed above the dopant ink composition 730 (or reduced volume region 730') in the first groove 706A. In an embodiment, forming the solid state dopant source includes forming a material layer such as, but not limited to, boron silica glass (BSG) or phosphorous silica glass (PSG). In either case, the conductivity type (e.g., n- or p-type is selected to be opposite the conductivity type of the dopant ink composition 730.

Figure 7E:
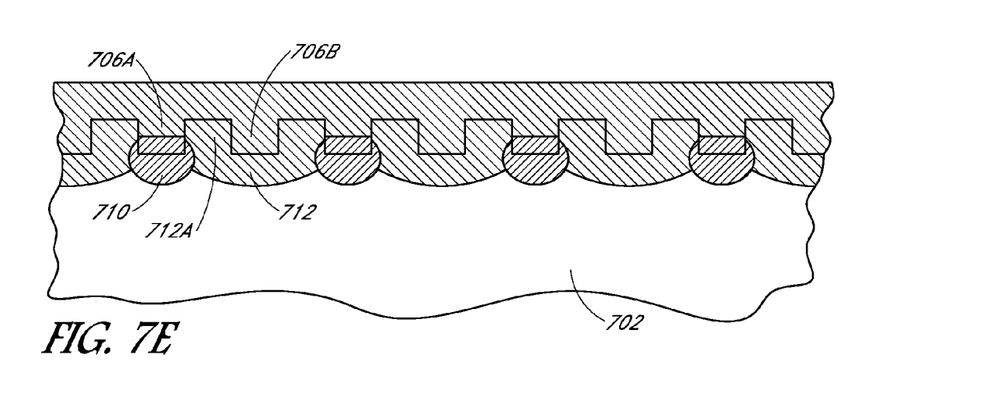
FIG. 7E illustrates a cross-sectional view of a stage in the fabrication of a solar cell, corresponding to operation 608 of the flowchart of FIG. 6, in accordance with an embodiment of the present invention.

In an embodiment, prior to forming the solid state dopant source 740, the dopant ink composition 730 is cured to cross-link a substantial portion of, e.g., a siloxane species of the dopant ink composition. In one such embodiment, the curing is performed by using a non-thermal process. In another embodiment, however, the curing is performed by using a baking process. In a specific such embodiment, performing the baking process removes a substantial portion of an organic solvent of the dopant ink composition. The solvent removal may lead to volume reduction of the dopant ink composition. For example, in a particular embodiment, the baking process reduces a volume of the dopant ink composition 730 by a factor approximately in the range of 1.1-10, e.g., to provide reduced volume regions 730', as depicted in FIGS. 7C-7E. In an embodiment, the baking process includes heating to a temperature approximately in the range of 100-400 degrees Celsius.

Referring to operation 608 of flowchart 600, and corresponding FIG. 7E, the method also includes driving dopants from the dopant ink composition 730 (or reduced volume region 730') and the solid state dopant source 740 toward the substrate 702. Specifically, in one embodiment, driving the dopants includes forming a first doped region 710 of the first conductivity type in a portion of the substrate 702 below a surface of the first groove 706A, and forming a second doped region 712 of the second conductivity type in another portion of the substrate 702 below a surface of the second groove 706B, as is depicted in FIG. 7E. In an embodiment, since the solid state dopant source 740 is blanket deposited, a third doped region 712A of the second conductivity type is formed in the ridge separating the first and second grooves 706A and 706B, respectively. The third doped region 712A is continuous with and has essentially the same dopant concentration level as the second doped region 712. In an embodiment, driving dopants from the cured dopant ink composition 730 or 730' and the solid state dopant source 740 includes heating to a temperature approximately in the range of 850-1050 degrees Celsius.

Figure 7F:
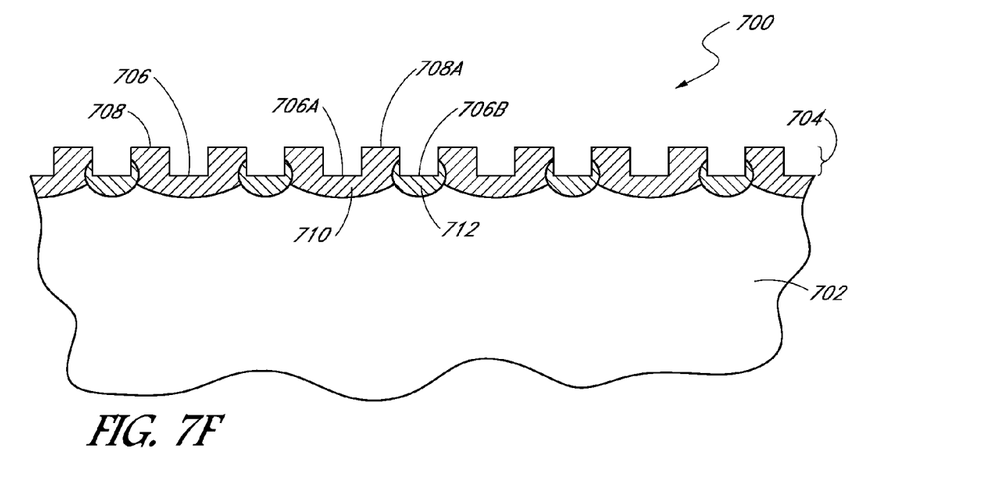
FIG. 7F illustrates a cross-sectional view of a stage in the fabrication of a solar cell, in accordance with an embodiment of the present invention.

Referring to FIG. 7F, the solid state dopant source 740 along with the dopant ink composition 730' are removed, e.g., by a wet etch process. The structure shown in FIG. 7F may then be used to fabricate a back-contact solar cell.

In another aspect of the present invention, a solar cell may be fabricated by forming doped regions from a dopant ink composition in a substrate with grooves positioned only for receiving a dopant ink composition of a first conductivity type. A solid state dopant source is then used, without depositing in a separate set of grooves, for forming doped regions of a second conductivity type. For example, FIGS. 8A-8F illustrate cross-sectional views of various stages in the fabrication of a solar cell, in accordance with an embodiment of the present invention.

Figure 8A:
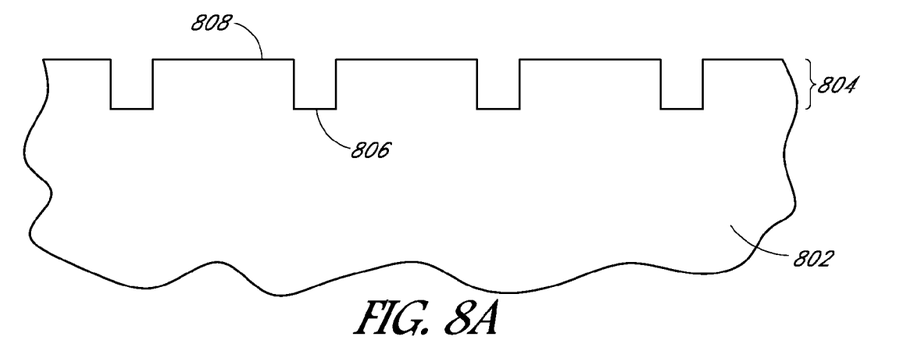
FIGS. 8A-8F illustrate cross-sectional views of various stages in the fabrication of a solar cell, in accordance with another embodiment of the present invention.

Referring to FIG. 8A, a method of fabricating a solar cell includes forming a pattern having a plurality of grooves 806 and ridges 808 in a surface 804 of a substrate 802. Approaches similar to those described above in association with operation 402 of flowchart 400 may be used to form the patterned substrate. For example, in one embodiment, forming the pattern in the surface of the substrate 802 includes reducing a roughness at the bottom of each of the plurality of grooves 806. However, instead of providing grooves to receive two different types of dopant sources (e.g., n and p, or ink and solid state), only one set of grooves is provided, reducing the number of grooves needed.

Figure 8B:
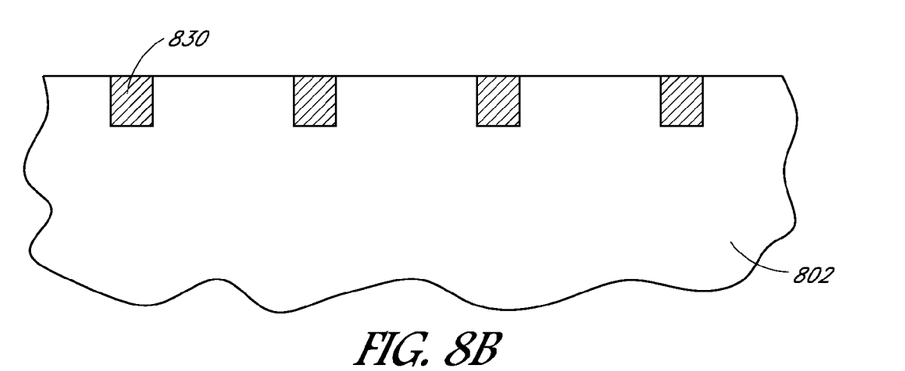

Referring to FIG. 8B, the method also includes delivering a dopant ink composition 830 of a first conductivity type in the grooves 806. The dopant ink composition may be p-type or n-type and may have a composition similar or the same as the dopant ink compositions described above. Furthermore, the dopant ink composition may be delivered in a manner similar to the approaches described above.

Figure 8C:
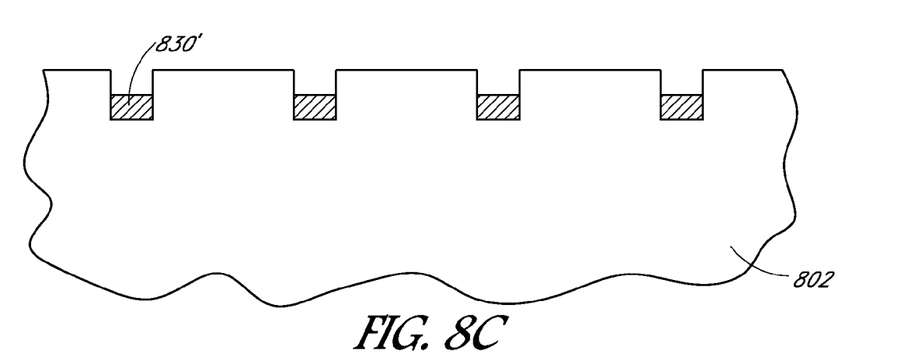

Referring to FIG. 8C, in an embodiment, the volume of the dopant ink composition 830 is reduced to provide reduced volume regions 830', as described in association with other embodiments above.

Figure 8D:
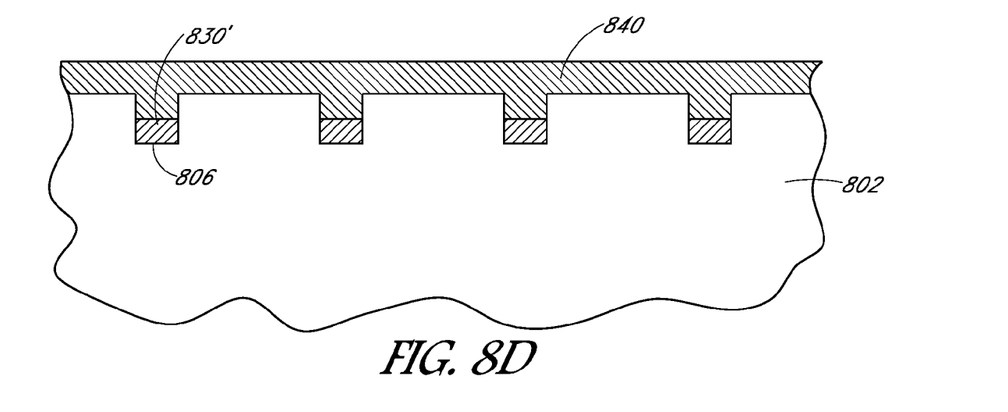

Referring to FIG. 8D, the method also includes forming a solid state dopant source 840 of a second, opposite, conductivity type above substrate 802 and above the dopant ink composition 830 (or reduced volume regions 830'), but not in a separate dedicated set of grooves. In one embodiment, the solid state dopant source 840 is blanket deposited above the substrate 802, as depicted in FIG. 8D. In an embodiment, forming the solid state dopant source includes forming a material layer such as, but not limited to, boron silica glass (BSG) or phosphorous silica glass (PSG). In either case, the conductivity type (e.g., n- or p-type is selected to be opposite the conductivity type of the dopant ink composition 830.

Figure 8E:
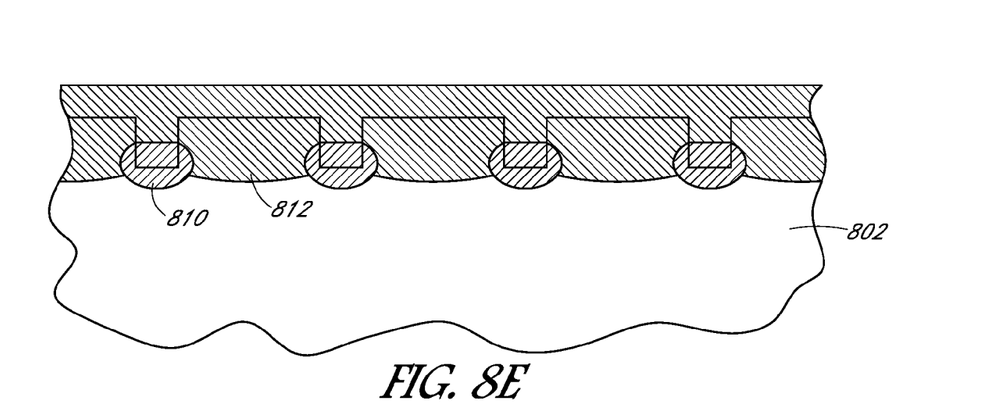

In an embodiment, prior to forming the solid state dopant source 840, the dopant ink composition 830 is cured to cross-link a substantial portion of, e.g., a siloxane species of the dopant ink composition. In one such embodiment, the curing is performed by using a non-thermal process. In another embodiment, however, the curing is performed by using a baking process. In a specific such embodiment, performing the baking process removes a substantial portion of an organic solvent of the dopant ink composition. The solvent removal may lead to volume reduction of the dopant ink composition. For example, in a particular embodiment, the baking process reduces a volume of the dopant ink composition 830 by a factor approximately in the range of 1.1-10, e.g., to provide reduced volume regions 830', as depicted in FIGS. 8C-8E. In an embodiment, the baking process includes heating to a temperature approximately in the range of 100-400 degrees Celsius.

Referring to FIG. 8E, the method also includes driving dopants from the dopant ink composition 830 (or reduced volume region 830') and the solid state dopant source 840 toward the substrate 802. Specifically, in one embodiment, driving the dopants includes forming a first doped region 810 of the first conductivity type in a portion of the substrate 802 below a surface of the grooves 806, and forming a second doped region 812 of the second conductivity type in another portion of the substrate 802, between portions 810, as is depicted in FIG. 8E. In an embodiment, driving dopants from the cured dopant ink composition 830 or 830' and the solid state dopant source 840 includes heating to a temperature approximately in the range of 850-1050 degrees Celsius.

Figure 8F:
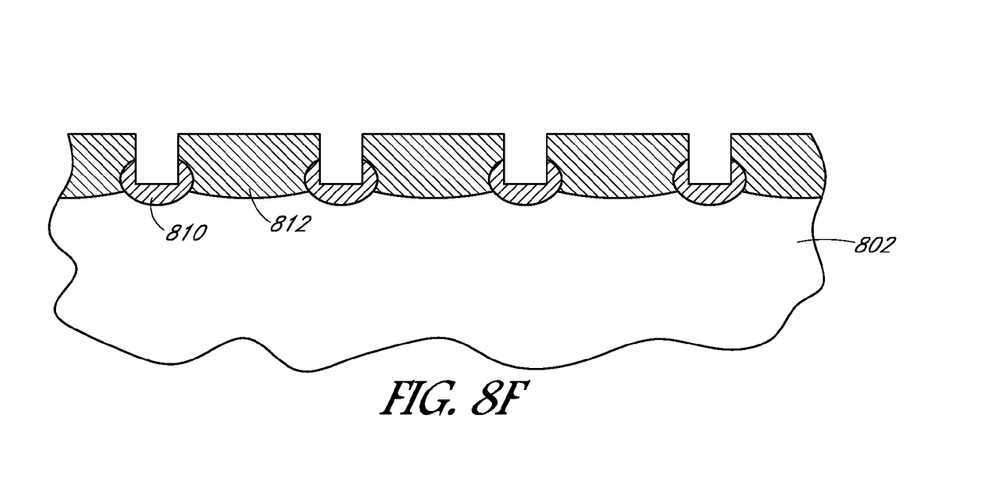

Referring to FIG. 8F, the solid state dopant source 840 along with the dopant ink composition 830' are removed, e.g., by a wet etch process. The structure shown in FIG. 8F may then be used to fabricate a back-contact solar cell.

In yet another embodiment, both n and p trenches or grooves are used and are patterned in a modified damage step. Subsequently, n and p inks may be printed simultaneously. In such an embodiment, groove or trench walls in between the n and p regions are fabricated as thin as possible so that the distance between the n and p regions is minimized. If the distance is too great, the design rules may enlarge and there could be less efficiency. Furthermore the breakdown voltage of the cells may significantly increase and may lead to a reliability issue resulting from higher power dissipated in the cell.

As mentioned above, a substrate having grooves and ridges may be fabricated from an incoming wafer having surface damage, such as an unprocessed silicon wafer. For example, FIGS. 9A-9D illustrate cross-sectional views of various stages in the fabrication of a substrate with grooves and ridges for fabricating a solar cell, in accordance with another embodiment of the present invention.

Figure 9A:
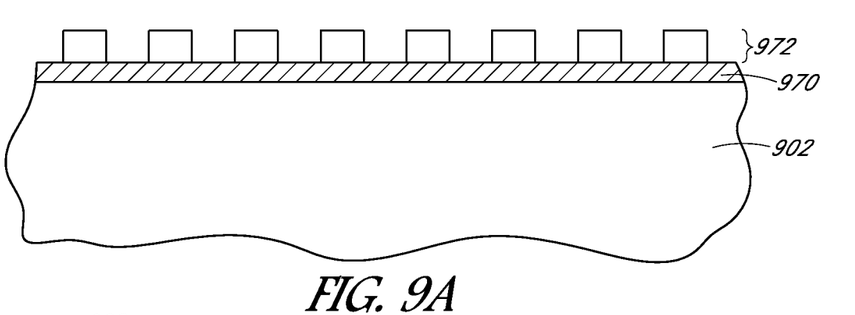
FIGS. 9A-9D illustrate cross-sectional views of various stages in the fabrication of a substrate with grooves and ridges for fabricating a solar cell, in accordance with another embodiment of the present invention.
Figure 9B:
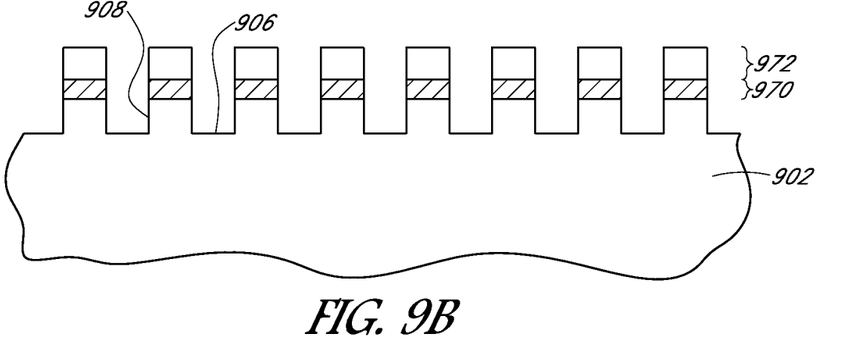

Referring to FIG. 9A, a substrate 902, such as an N-type doped substrate, having a surface damage layer 970 has disposed thereon an epoxy or photoresist mask 972. The pattern of the mask 972 is then transferred into the surface of the substrate 902 by, e.g., an etch process such as an alkaline wet etch process or a plasma etch process. In one embodiment, the pattern is transferred to a depth in substrate 902 below the surface damage layer 970, as depicted in FIG. 9B. The result is a plurality of grooves 906 and ridges 908 formed in substrate 902.

Figure 9C:
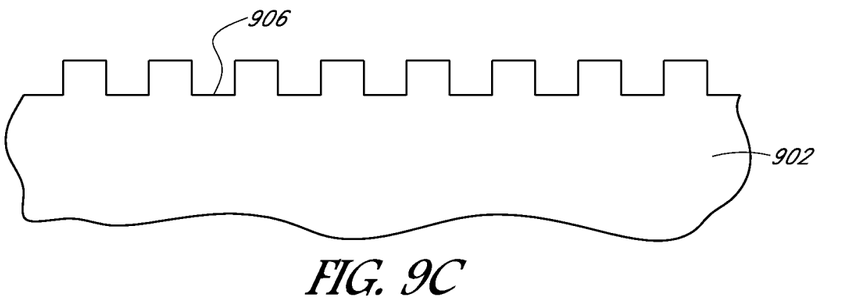
Figure 9D:
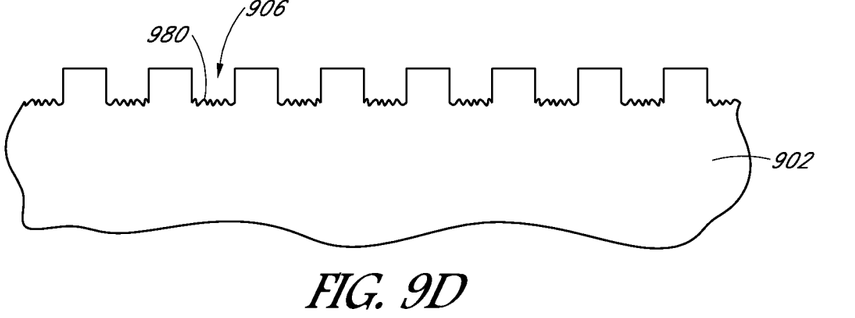

Referring to FIG. 9C, the surface damage layer 970 and the mask 972 are removed, e.g., by a wet etch process. In one embodiment, forming the pattern in the surface of the substrate 902 includes reducing a roughness at the bottom of each of the plurality of grooves 906, e.g., with a wet etch process such as HF/nitric acid, as is depicted in FIG. 9C. In another embodiment, forming the pattern in the surface of the substrate includes increasing a roughness or introducing a texture 980 at the bottom of each of the plurality of grooves 906, e.g., with a wet etch process such as an alkaline etch based on potassium hydroxide, as is depicted in FIG. 9D.

Thus, solar cells with doped groove regions separated by ridges and methods of fabricating solar cells have been disclosed. In accordance with an embodiment of the present invention, a solar cell includes a substrate having a surface with a plurality of grooves and ridges. A first doped region of a first conductivity type is disposed in a first of the grooves. A second doped region of a second conductivity type, opposite the first conductivity type, is disposed in a second of the grooves. The first and second grooves are separated by one of the ridges. In one such embodiment, the ridge separating the first and second grooves includes an undoped or lightly doped region. In another such embodiment, the ridge separating the first and second grooves includes dopants of first conductivity type continuous with the first doped region and contiguous with the second doped region. In another such embodiment, the solar cell further includes a semiconductor layer disposed in each of the grooves. The first doped region is disposed in the portion of the semiconductor layer disposed in the first groove, and the second doped region is disposed in the portion of the semiconductor layer disposed in the second groove.

What is claimed is:

1. A solar cell, comprising:
   a substrate having a surface with a plurality of grooves and a plurality of ridges, each of the plurality of grooves having a bottommost surface with a plane parallel with a plane of an uppermost surface of each of the plurality of ridges, wherein the bottommost surface of each of the plurality of grooves is smooth, and wherein the substrate has an undoped or lightly doped region;
   a first doped region of the substrate having a concentration of dopants higher than the undoped or lightly doped region of the substrate, the first doped region of a first conductivity type and disposed below the bottommost surface of a first groove of the plurality of grooves; and
   a second doped region of the substrate having a concentration of dopants higher than the undoped or lightly doped region of the substrate, the second doped region of a second conductivity type, opposite the first conductivity type, and disposed below the bottommost surface of a second groove of the plurality of grooves, the first and second grooves separated by one of the plurality of ridges,
   wherein the first doped region of the substrate extends continuously between the one of the plurality of ridges and a directly adjacent second of the plurality of ridges and is contiguous with the second doped region of the substrate, wherein the first doped region of the substrate only includes dopants of the first conductivity type,
   wherein the second doped region of the substrate extends by an amount into the one of the plurality of ridges and wherein the one of the plurality of ridges is entirely filled with the first doped region and the second doped region.

2. The solar cell of claim 1, wherein the substrate comprises silicon, the first doped region of the substrate only includes n-type dopants for silicon, and the second doped region of the substrate comprises p-type dopants for silicon.

3. A solar cell, comprising:
   a substrate having a surface with a plurality of grooves and a plurality of ridges, each of the plurality of grooves having a bottommost surface with a plane parallel with a plane of an uppermost surface of each of the plurality of ridges and wherein the substrate has an undoped or lightly doped region;
   a first doped region of the substrate having a concentration of dopants higher than the undoped or lightly doped region of the substrate, the first doped region of a first conductivity type and disposed below the bottommost surface of a first groove of the plurality of grooves; and
   a second doped region of the substrate having a concentration of dopants higher than the undoped or lightly doped region of the substrate, the second doped region of a second conductivity type, opposite the first conductivity type, and disposed below the bottommost surface of a second groove of the plurality of grooves, the first and second grooves separated by one of the plurality of ridges,
   wherein the first doped region of the substrate extends continuously between the one of the plurality of ridges and a directly adjacent second of the plurality of ridges and is contiguous with the second doped region of the substrate, wherein the first doped region of the substrate only includes dopants of the first conductivity type, wherein the second doped region of the substrate extends by an amount into the one of the plurality of ridges and wherein the one of the plurality of ridges is entirely filled with the first doped region and the second doped region.

4. The solar cell of claim 3, wherein the substrate comprises silicon, the first doped region of the substrate only includes n-type dopants for silicon, and the second doped region of the substrate comprises p-type dopants for silicon.

5. The solar cell of claim 3, wherein the bottommost surface of each of the plurality of grooves is smooth.

* * * * *